(12) United States Patent
Inoue et al.

(10) Patent No.: US 12,418,007 B2
(45) Date of Patent: Sep. 16, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Kazuhiro Inoue, Kitakyushu Fukuoka (JP); Mami Fujihara, Nakatsu Oita (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 416 days.

(21) Appl. No.: 18/118,697

(22) Filed: Mar. 7, 2023

(65) Prior Publication Data
US 2023/0387094 A1  Nov. 30, 2023

(30) Foreign Application Priority Data

May 31, 2022 (JP) .................................. 2022-088345

(51) Int. Cl.
*H01L 23/00* (2006.01)
*H01L 25/16* (2023.01)

(52) U.S. Cl.
CPC ............ *H01L 25/167* (2013.01); *H01L 24/05* (2013.01); *H01L 24/32* (2013.01); *H01L 24/48* (2013.01);
(Continued)

(58) Field of Classification Search
CPC ....... H01L 25/167; H01L 24/05; H01L 24/32; H01L 24/48; H01L 24/73; H01L 25/165; H01L 2224/04042; H01L 2224/32145; H01L 2224/32227; H01L 2224/48137; H01L 2224/48227; H01L 2224/73265;
(Continued)

(56) References Cited

U.S. PATENT DOCUMENTS

| | | | |
|---|---|---|---|
| 2020/0091367 | A1 | 3/2020 | Nakashima et al. |
| 2020/0194411 | A1 | 6/2020 | Saito et al. |

(Continued)

FOREIGN PATENT DOCUMENTS

| | | | |
|---|---|---|---|
| JP | 2015-012118 | A | 1/2015 |
| JP | 2020-047778 | A | 3/2020 |

(Continued)

*Primary Examiner* — Elias Ullah
(74) *Attorney, Agent, or Firm* — Knobbe, Martens, Olson & Bear, LLP

(57) ABSTRACT

A semiconductor device includes a substrate, a light-receiving element, a switching element, a light-emitting element on the switching element, first and second conductive members. The substrate includes first to third metal pads on a front-side thereof. The light-receiving element includes first and second bonding pads on a front-surface thereof. A back-surface of the light-receiving element is connected to the first and second metal pads. The first and second bonding pads each overlap one of the first and second metal pads. The switching element includes front-side and backside electrodes and a control pad. The backside electrode is connected to the third metal pad. The first conductive member is connected to the front-side electrode of the switching element and the first bonding pad of the light-receiving element. The second conductive member is connected to the control pad of the switching element and the second bonding pad of the light-receiving element.

16 Claims, 8 Drawing Sheets

(52) U.S. Cl.
CPC ............ *H01L 24/73* (2013.01); *H01L 25/165* (2013.01); *H01L 2224/04042* (2013.01); *H01L 2224/32145* (2013.01); *H01L 2224/32227* (2013.01); *H01L 2224/48137* (2013.01); *H01L 2224/48227* (2013.01); *H01L 2224/73265* (2013.01)

(58) Field of Classification Search
CPC .................. H01L 24/29; H01L 23/293; H01L 23/3157; H01L 23/492; H01L 2224/29016; H01L 2224/29082; H10H 20/857
See application file for complete search history.

(56) References Cited

U.S. PATENT DOCUMENTS

| | | |
|---|---|---|
| 2021/0175221 A1 | 6/2021 | Tonedachi |
| 2021/0247567 A1 | 8/2021 | Fujihara et al. |
| 2021/0249391 A1 | 8/2021 | Fujihara et al. |

FOREIGN PATENT DOCUMENTS

| | | |
|---|---|---|
| JP | 2020-096105 A | 6/2020 |
| JP | 2021-089971 A | 6/2021 |
| JP | 2021-125620 A | 8/2021 |
| JP | 2021-125670 A | 8/2021 |

SEMICONDUCTOR DEVICE

CROSS-REFERENCE TO RELATED APPLICATIONS

This application is based upon and claims the benefit of priority from Japanese Patent Application No. 2022-088345, filed on May 31, 2022; the entire contents of which are incorporated herein by reference.

FIELD

Embodiments relate to a semiconductor device.

BACKGROUND

Semiconductor devices are generally required to be downsized. A semiconductor device may have a structure, for example, in which multiple semiconductor elements are mounted on a substrate and subsequently resin-sealed on the substrate. Such a device preferably has a height reduced by using a thin substrate. However, discrepancies such as warp and like may occur when heating the thin substrate.

DETAILED DESCRIPTION

Figure 1:
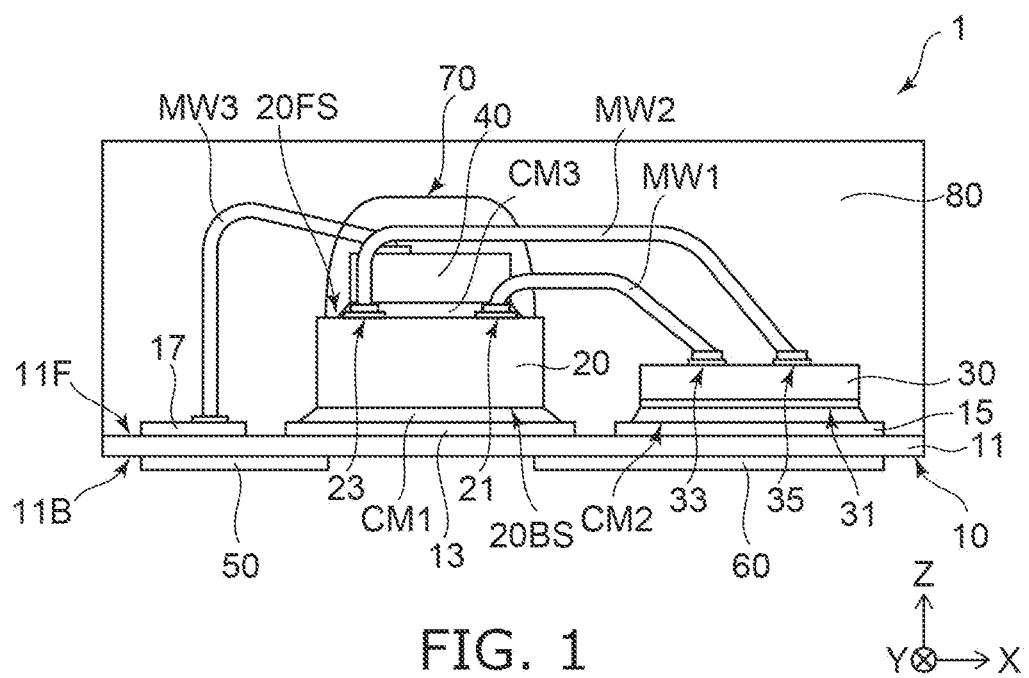
FIG. 1 is a schematic view showing a semiconductor device according to an embodiment.

According to one embodiment, a semiconductor device includes a substrate, a light-receiving element, a switching element, a first conductive member, a second conductive member, and a light-emitting element. The substrate includes a resin base material having a first surface and first to third metal pads on the first surface. The first to third metal pads are arranged along the first surface. The third metal pad is apart from the first and second metal pads. The first surface includes a portion provided between the first and second metal pads. The light-receiving element is provided at the first surface side of the resin base material. The light-receiving element includes a front surface, a back surface, a first bonding pad and a second bonding pad. The back surface is provided at a side opposite to the front surface and connected via a first connection member to the first metal pad, the second metal pad, and the portion of the first surface of the resin base material. The first and second bonding pads are provided on the front surface of the light-receiving element. The first bonding pad overlaps one of the first and second metal pads in a first direction perpendicular to the first surface of the resin base material. The second bonding pad overlaps one of the first and second metal pads in the first direction. The switching element is provided at the first surface side of the resin base material, and includes a front-side electrode, a backside electrode and a control pad. The front-side electrode is provided at a front surface side of the switching element. The backside electrode is provided at a back surface side opposite to the front surface side of the switching element and is connected to the third metal pad via a second connection member. The front-side electrode and the control pad are arranged at the front surface side of the switching element. The first conductive member is connected to the front-side electrode of the switching element and the first bonding pad of the light-receiving element. The first conductive member electrically connects the front-side electrode and the first bonding pad. The second conductive member is connected to the control pad of the switching element and the second bonding pad of the light-receiving element. The second conductive member electrically connects the control pad and the second bonding pad. The light-emitting element is provided on the front surface of the light-receiving element with a third connection member interposed. The third connection member transmits light radiated from the light-emitting element toward the light-receiving element.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic view showing a semiconductor device 1 according to an embodiment. The semiconductor device 1 is, for example, a photo-relay. The semiconductor device 1 includes a substrate 10, a light-receiving element 20, a switching element 30, and a light-emitting element 40.

The substrate 10 includes a resin base material 11, multiple metal pads 13, 15, and 17, an input-side terminal 50, and an output-side terminal 60. The resin base material 11 is, for example, sheet-like polyimide.

The resin base material 11 includes a first surface 11F, and a second surface 11B at a side opposite to the first surface 11F. The multiple metal pads 13, 15, and 17 are provided on the first surface 11F. The input-side terminal 50 and the output-side terminal 60 are provided on the second surface 11B of the resin base material 11. The resin base material 11 is, for example, polyimide resin or epoxy resin.

The multiple metal pads 13, 15, and 17 are apart from each other on the first surface 11F. Also, the input-side terminal 50 and the output-side terminal 60 are apart from each other on the second surface 11B. The multiple metal pads 13, 15, and 17, the input-side terminal 50, and the output-side terminal 60 are, for example, copper films provided with gold plating on the front surface.

The light-receiving element 20, the switching element 30, and the light-emitting element 40 are provided at the first surface 11F side of the resin base material 11.

The light-receiving element 20 includes a back surface 20BS connected to the metal pad 13 via a first connection member CM1, and a front surface 20FS at the side opposite to the back surface 20BS. The light-receiving element 20 further includes a first bonding pad 21 and a second bonding pad 23 provided on the front surface 20FS. The first connection member CM1 is, for example, a bonding material that includes a resin. The first connection member CM1 may be conductive or insulative.

The switching element 30 includes a backside electrode 31, a front-side electrode 33 and a control pad 35. The backside electrode 31 is connected to the metal pad 15 via a second connection member CM2. The front-side electrode 33 is provided on the front surface at the side opposite to the back surface at which the backside electrode 31 is provided. The control pad 35 is provided on the same front surface as the front-side electrode 33. The second connection member CM2 is, for example, a conductive bonding material such as a silver paste, etc.

The front-side electrode 33 is electrically connected to the first bonding pad 21 of the light-receiving element 20 via a first conductive member MW1. The control pad 35 is electrically connected to the second bonding pad 23 of the light-receiving element 20 via a second conductive member MW2. The first conductive member MW1 and the second conductive member MW2 are, for example, metal wires.

The light-emitting element 40 is connected via a third connection member CM3 to the light-receiving element 20 at the front surface 20FS side thereof. The third connection member CM3 is, for example, a transparent resin and transmits light radiated from the light-emitting element 40 toward the light-receiving element 20. The light-emitting element 40 is electrically connected to the metal pad 17 by a third conductive member MW3. The third conductive member MW3 is, for example, a metal wire.

The light-emitting element 40 is sealed on the front surface 20FS of the light-receiving element 20 by a resin member 70. The resin member 70 is, for example, silicone. Furthermore, the light-receiving element 20, the switching element 30, and the resin member 70 are sealed at the first surface 11F side of the resin base material 11 by a resin member 80. The resin member 80 is, for example, an epoxy resin or a silicone resin.

Figure 2A:
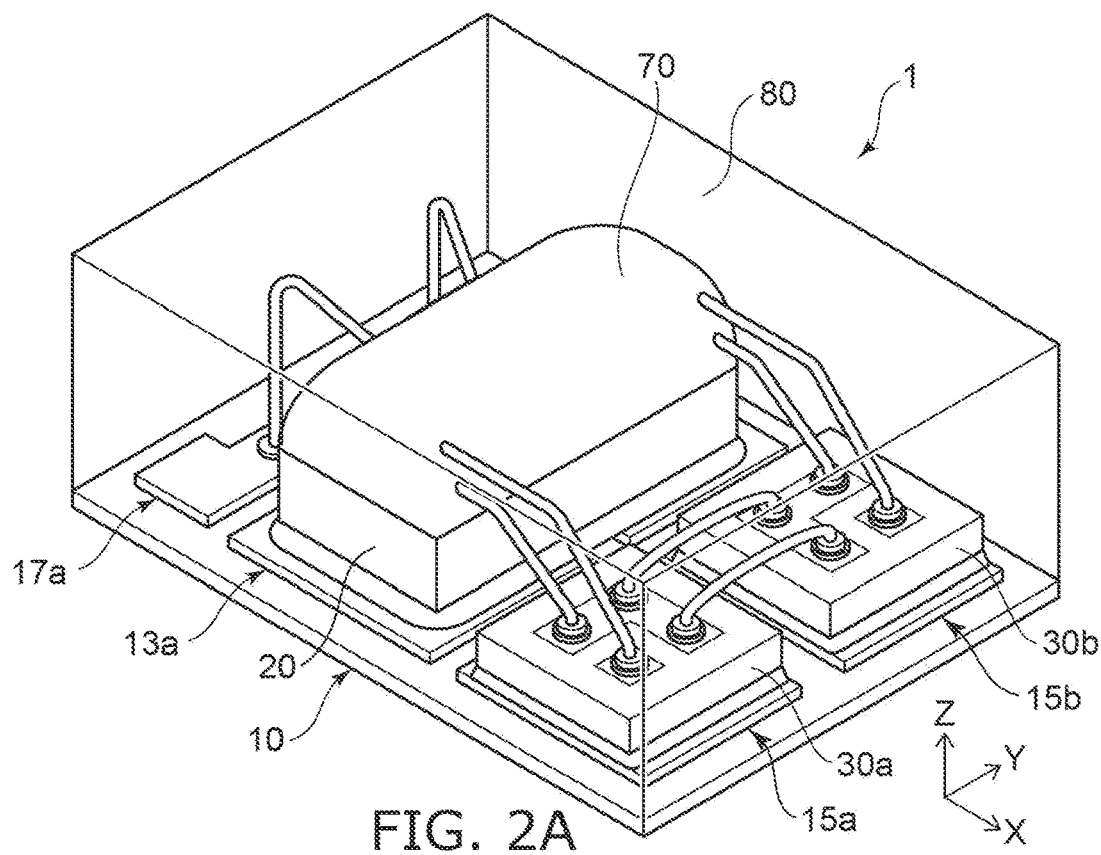
FIGS. 2A and 2B are other schematic views showing the semiconductor device according to the embodiment.
Figure 2B:
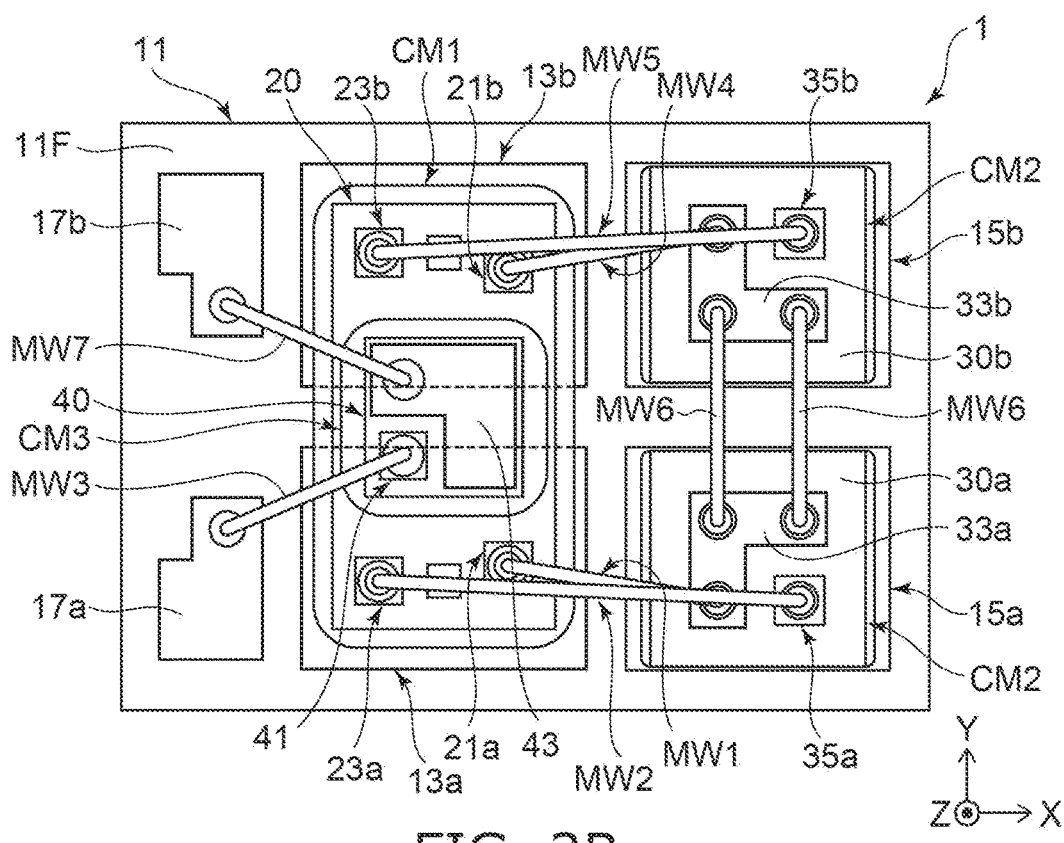

FIGS. 2A and 2B are other schematic views showing the semiconductor device 1 according to the embodiment. FIG. 2A is a perspective view showing the semiconductor device 1. FIG. 2B is a plan view showing the layout at the first surface 11F side of the resin base material 11. The resin members 70 and 80 are not illustrated in FIG. 2B.

As shown in FIG. 2A, the semiconductor device 1 includes, for example, a first switching element 30a and a second switching element 30b. The first switching element 30a and the second switching element 30b each are electrically connected to the light-receiving element 20.

The resin member 80 seals the light-receiving element 20, the switching element 30, and the light-emitting element 40. The conductive members MW and the metal pads 13, 15, and 17 provided on the first surface 11F of the resin base material 11 also are sealed inside the resin member 80. In other words, the components that are provided on the substrate 10 are housed inside a resin package that includes the resin base material 11 and the resin member 80. In the following description, there may be a case in which the first switching element 30a and the second switching element 30b are referred to as the switching element 30 without distinction. The other components also described in the same manner.

As shown in FIG. 2B, the multiple metal pads 13, 15, and 17 include a first metal pad 13a, a second metal pad 13b, a third metal pad 15a, a fourth metal pad 15b, a fifth metal pad 17a, and a sixth metal pad 17b.

The first metal pad 13a, the third metal pad 15a, and the fifth metal pad 17a are arranged in a direction, e.g., an X-direction, along the first surface 11F. The first metal pad 13a is provided between the third metal pad 15a and the fifth metal pad 17a.

The second metal pad 13b, the fourth metal pad 15b, and the sixth metal pad 17b also are arranged, for example, in the X-direction. The second metal pad 13b is provided between the fourth metal pad 15b and the sixth metal pad 17b.

The first metal pad 13a and the second metal pad 13b are separated from each other and are arranged in a direction, e.g., a Y-direction, crossing the X-direction. The third metal pad 15a and the fourth metal pad 15b also are apart from each other and are arranged in, for example, the Y-direction. The fifth metal pad 17a and the sixth metal pad 17b also are apart from each other and are arranged in, for example, the Y-direction.

The light-receiving element 20 is provided over the first metal pad 13a and the second metal pad 13b. The first surface 11F includes a portion located between the first metal pad 13a and the second metal pad 13b. The light-receiving element 20 is connected to the first metal pad 13a, the second metal pad 13b, and the portion of the first surface 11F via the first connection member CM1. The light-receiving element 20 includes first bonding pads 21a and 21b and second bonding pads 23a and 23b. The first bonding pad 21a and the second bonding pad 23a are provided on the front surface of the light-receiving element 20 such that the first bonding pad 21a and the second bonding pad 23a overlap the first metal pad 13a in a direction, e.g., a Z-direction, perpendicular to the first surface 11F of the resin base material 11. The first bonding pad 21b and the second bonding pad 23b also are provided on the front surface of the light-receiving element 20 such that the first bonding pad 21b and the second bonding pad 23b overlap the second metal pad 13b in the Z-direction.

The first switching element 30a is provided on the third metal pad 15a with the second connection member CM2 interposed. The first switching element 30a includes the backside electrode 31 (see FIG. 1), a front-side electrode 33a, and a control pad 35a. The backside electrode 31 is connected to the third metal pad 15a via the second connection member CM2. The second connection member CM2 is conductive; and the backside electrode 31 is electrically connected to the third metal pad 15a.

The front-side electrode 33a is electrically connected to the first bonding pad 21a of the light-receiving element 20 via the first conductive member MW1. The first conductive member MW1 is, for example, a metal wire and is connected to the front-side electrode 33a and the first bonding pad 21a. The control pad 35a is electrically connected to the second bonding pad 23a of the light-receiving element 20 via the second conductive member MW2. The second conductive member MW2 is, for example, a metal wire and is connected to the control pad 35a and the second bonding pad 23a.

The second switching element 30b is provided on the fourth metal pad 15b with another second connection member CM2 interposed. The second switching element 30b includes a control pad 35b, a front-side electrode 33b, and another backside electrode 31. The backside electrode 31 is electrically connected to the fourth metal pad 15b via the second connection member CM2. The front-side electrode 33b is electrically connected to the first bonding pad 21b of the light-receiving element 20 via a fourth conductive member MW4. The control pad 35b is electrically connected to the second bonding pad 23b of the light-receiving element 20 via a fifth conductive member MW5. The fourth conductive member MW4 and the fifth conductive member MW5 are, for example, metal wires.

The front-side electrode 33a of the first switching element 30a is electrically connected to the front-side electrode 33b of the second switching element 30b via a sixth conductive member MW6. The front-side electrode 33a may be electrically connected to the front-side electrode 33b via multiple sixth conductive members MW6. The sixth conductive member MW6 is, for example, a metal wire.

The light-emitting element 40 is provided on the front surface 20FS of the light-receiving element 20 with the third connection member CM3 interposed (see FIG. 1). The light-emitting element 40 is provided between the first bonding pads 21a and 21b and between the second bonding pads 23a and 23b.

The light-emitting element 40 includes a back surface connected to the light-receiving element 20 via the third connection member CM3, and a front surface at the side opposite to the back surface. The light-emitting element 40 includes a first electrode 41 and a second electrode 43. The first electrode 41 and the second electrode 43 are arranged on the front surface at the side opposite to the back surface. The first electrode 41 is electrically connected to the fifth metal pad 17a via the third conductive member MW3. The second electrode 43 is electrically connected to the sixth metal pad 17b via a seventh conductive member MW7. The seventh conductive member MW7 is, for example, a metal wire.

Figure 3A:
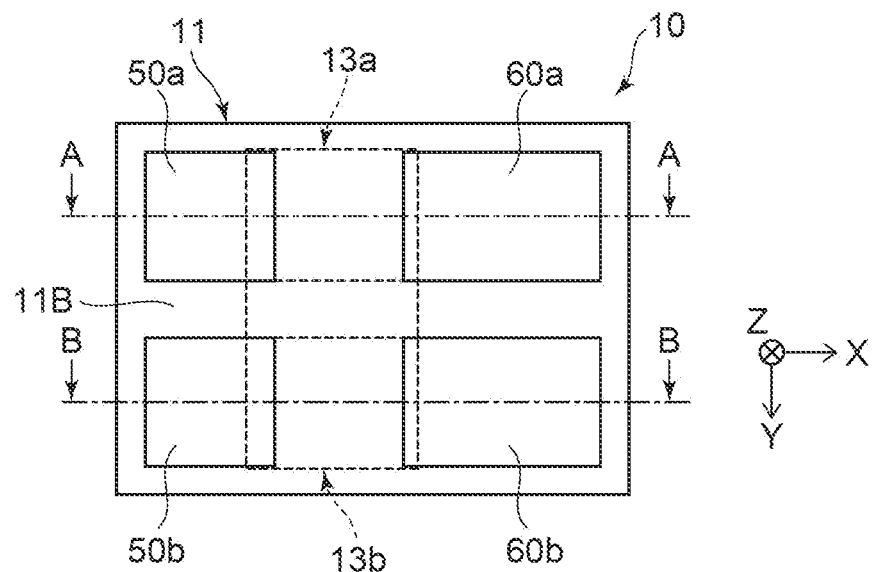
FIGS. 3A to 3C are schematic views showing the substrate of the semiconductor device according to the embodiment.
Figure 3B:
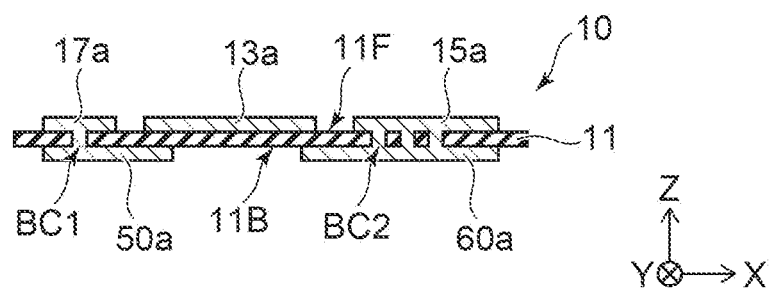
Figure 3C:
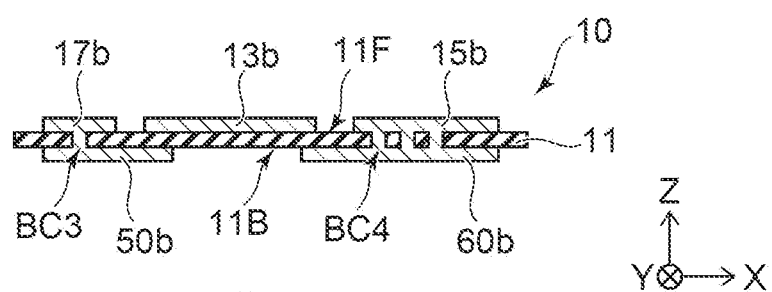

FIGS. 3A to 3C are schematic views showing the substrate 10 of the semiconductor device 1 according to the embodiment. FIG. 3A is a plan view showing the second surface 11B of the resin base material 11. FIG. 3B is a cross-sectional view along line A-A shown in FIG. 3A. FIG. 3C is a cross-sectional view along line B-B shown in FIG. 3A.

As shown in FIG. 3A, the semiconductor device 1 includes the multiple input-side terminals 50 and the multiple output-side terminals 60. The multiple input-side terminals 50 and the multiple output-side terminals 60 are apart from each other. The input-side terminals 50 and the output-side terminals 60 are, for example, copper films provided with gold plating.

The multiple input-side terminals 50 and the multiple output-side terminals 60 include, for example, a first input-side terminal 50a, a second input-side terminal 50b, a first output-side terminal 60a, and a second output-side terminal 60b. The first input-side terminal 50a and the second input-side terminal 50b are arranged, for example, in the Y-direction on the second surface 11B of the resin base material 11. The first output-side terminal 60a and the second output-side terminal 60b are arranged, for example, in the Y-direction on the second surface 11B of the resin base material 11. The first input-side terminal 50a and the first output-side terminal 60a are arranged, for example, in the X-direction. The second input-side terminal 50b and the second output-side terminal 60b are arranged, for example, in the X-direction.

As shown in FIG. 3B, the resin base material 11 extends between the first input-side terminal 50a and the fifth metal pad 17a. The resin base material 11 extends between the first output-side terminal 60a and the third metal pad 15a. The first input-side terminal 50a is electrically connected to the fifth metal pad 17a by a via contact BC1 provided in the resin base material 11. The first output-side terminal 60a is electrically connected to the third metal pad 15a by a via contact BC2 provided in the resin base material 11. Moreover, the multiple via contacts BC2 may electrically connects the first output-side terminal 60a and the third metal pad 15a.

The resin base material 11 includes a portion of the second surface 11B located between the first input-side terminal 50a and the first output-side terminal 60a. The first metal pad 13a is provided at the side opposite to the portion of the second surface 11B of the resin base material 11. The first input-side terminal 50a includes, for example, a portion overlapping the first metal pad 13a in the Z-direction via the resin base material 11. The first output-side terminal 60a includes, for example, a portion overlapping the first metal pad 13a in the Z-direction via the resin base material 11. In other words, the first metal pad 13a is provided via the resin base material 11 on an edge of the first input-side terminal 50a and an edge of the first output-side terminal 60a.

As shown in FIG. 3C, the resin base material 11 extends between the second input-side terminal 50b and the sixth metal pad 17b. Also, the resin base material 11 extends between the second output-side terminal 60b and the fourth metal pad 15b. The second input-side terminal 50b is electrically connected to the sixth metal pad 17b by a via contact BC3 provided in the resin base material 11. The second output-side terminal 60b is electrically connected to the fourth metal pad 15b by a via contact BC4 provided in the resin base material 11. Moreover, the multiple via contacts BC4 may electrically connects the second output-side terminal 60b and the fourth metal pad 15b.

The resin base material 11 includes a portion of the second surface 11B located between the second input-side terminal 50b and the second output-side terminal 60b. The second metal pad 13b is provided at the side opposite to the portion of the second surface 11B of the resin base material 11. The second input-side terminal 50b includes, for example, a portion overlapping the second metal pad 13b in the Z-direction via the resin base material 11. The second output-side terminal 60b includes, for example, a portion overlapping second metal pad 13b in the Z-direction via the resin base material 11. In other words, the second metal pad 13b is provided via the resin base material 11 on an edge of the second input-side terminal 50b and an edge of the second output-side terminal 60b.

Figure 4:
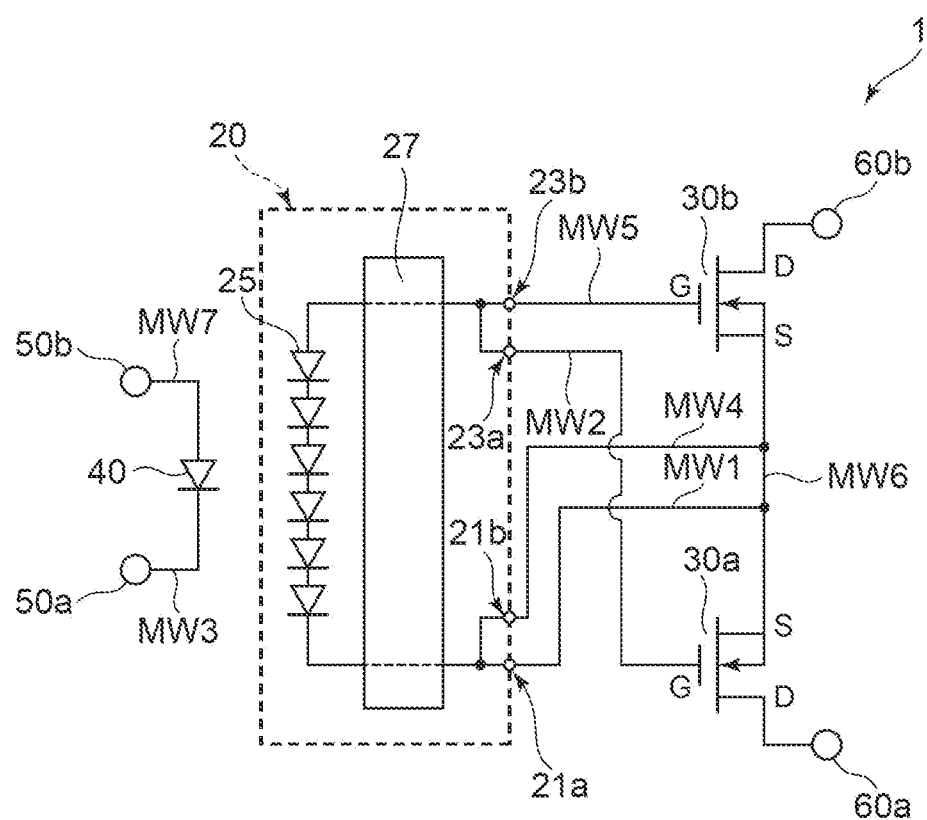
FIG. 4 is a circuit diagram showing the semiconductor device according to the embodiment.

FIG. 4 is a circuit diagram showing the semiconductor device 1 according to the embodiment. The light-receiving element 20 is, for example, a photodiode. The first switching element 30a and the second switching element 30b are, for example, MOS transistors. The light-emitting element 40 is, for example, a light-emitting diode.

The light-receiving element 20 includes multiple photodiodes 25 and a control circuit 27. The multiple photodiodes 25 are connected in series. The photodiodes 25 are configured to detect the light of the light-emitting element 40. The control circuit 27 is, for example, a waveform shaping circuit. The control circuit 27 may include a discharging circuit, a protection circuit and like.

The output of the photodiodes 25 is output to the first bonding pads 21a and 21b and the second bonding pads 23a and 23b via the control circuit 27. The first bonding pads 21a and 21b are electrically connected to, for example, the cathode side of the photodiodes 25. The second bonding pads 23a and 23b are electrically connected to, for example, the anode side of the photodiodes 25.

The first bonding pad 21a of the light-receiving element 20 is electrically connected to a source S (the front-side electrode 33a) of the switching element 30a via the first conductive member MW1. The first bonding pad 21b of the light-receiving element 20 is electrically connected to the source S (the front-side electrode 33b) of the switching element 30b via the fourth conductive member MW4. The source S of the switching element 30a is connected to the source S of the switching element 30b via the sixth conductive member MW6.

The second bonding pad 23a of the light-receiving element 20 is electrically connected to a gate G (the control pad 35a) of the first switching element 30a via the second conductive member MW2. The second bonding pad 23b of the light-receiving element 20 is electrically connected to the gate G (the control pad 35b) of the second switching element 30b via the fifth conductive member MW5.

The light-emitting element 40 is electrically connected to the first input-side terminal 50a via the third conductive member MW3. The first input-side terminal 50a is electrically connected to the fifth metal pad 17a by the via contact BC1 (see FIG. 3B); and the third conductive member MW3 is bonded to the fifth metal pad 17a and the first electrode 41 of the light-emitting element 40 (see FIG. 2B). The first electrode 41 is electrically connected to, for example, the cathode of the light-emitting diode.

Also, the light-emitting element 40 is electrically connected to the second input-side terminal 50b via the seventh conductive member MW7. The second input-side terminal 50b is electrically connected to the sixth metal pad 17b by the via contact BC3 (see FIG. 3B); and the seventh conductive member MW7 is bonded to the sixth metal pad 17b and the second electrode 43 of the light-emitting element 40. The second electrode 43 is electrically connected to, for example, the anode of the light-emitting diode.

The first output-side terminal 60a is electrically connected to a drain D (the backside electrode 31) of the first switching element 30a. The first output-side terminal 60a is electrically connected to the third metal pad 15a by the via contact BC2 (see FIG. 3A); and the backside electrode 31 of the first switching element 30a is electrically connected to the third metal pad 15a via the second connection member CM2 (see FIG. 2B).

The second output-side terminal 60b is electrically connected to the drain D (the other backside electrode 31) of the second switching element 30b. The second output-side terminal is electrically connected to the fourth metal pad 15b by the via contact BC4 (see FIG. 3B); and the backside electrode 31 of the second switching element 30b is electrically connected to the fourth metal pad 15b via the other second connection member CM2 (see FIG. 2B).

For example, the on-off control signal is input to the first and second input-side terminals 50a and 50b to control the electrical conduction between the first output-side terminal 60a and the second output-side terminal 60b. The light-emitting element 40 radiates an optical signal corresponding to the signal input to the first and second input-side terminals 50a and 50b; and the light-receiving element 20 detects the optical signal radiated from the light-emitting element 40. The light-receiving element 20 outputs a control signal corresponding to the optical signal to the gates G of the first and second switching elements 30a and 30b. The electrical conduction between the first output-side terminal 60a and the second output-side terminal 60b is controlled thereby.

For example, when transmitting a high-frequency signal from the first output-side terminal 60a to the second output-side terminal 60b, it is preferable to reduce the transmission loss by reduce the impedance between the first output-side terminal 60a and the second output-side terminal 60b. In the semiconductor device 1, the impedances between the switching element 30a and the first output-side terminal 60a and between the switching element 30b and the second output-side terminal 60b are reduced by reducing the Z-direction thickness of the resin base material 11. The pass characteristics of the high-frequency signal between the first output-side terminal 60a and the second output-side terminal 60b can be improved thereby.

The Z-direction thickness of the resin base material 11 is, for example, 50 micrometers. The Z-direction thicknesses of the metal pads 13, 15, and 17 are, for example, 30 micrometers; and the Z-direction thicknesses of the input-side terminal 50 and the output-side terminal 60 are, for example, 30 micrometers. Thus, the Z-direction thickness of the resin base material 11 is preferably less than the combined thickness of the copper films provided respectively on the first surface 11F and on the second surface 11B. However, when such a thin resin base material 11 is used in the substrate 10, for example, warp or deformation is generated in the resin base material 11 by thermal stress due to the difference between the linear thermal expansion coefficients of the resin base material 11 and the copper films. Therefore, in the manufacturing processes of the semiconductor device 1, a mechanical failure may occur due to the degraded flatness of the resin base material 11.

As shown in FIGS. 3B and 3C, the input-side terminals 50 face the metal pads 17 via the resin base material 11. The output-side terminals 60 face the metal pads 15 via the resin base material 11. The thermal stress in the resin base material 11 due to the different linear thermal expansion coefficients is cancelled and reduced between the terminal and the metal pad facing each other via the resin base material 11. However, the thermal stress is not canceled at the second surface 11B side of the resin base material 11 that faces the metal pads 13 because a copper film is not provided. Therefore, warp and/or deformation caused by the metal pads 13 easily occurs in the substrate 10.

In contrast, in the semiconductor device 1, the thermal stress is reduced by providing multiple metal pads 13 on the resin base material 11 so that the area occupied by the multiple metal pads 13 is reduced. Moreover, the first surface 11F of the resin base material 11 includes a portion located between the multiple metal pads 13; and the connection strength between the substrate 10 and the light-receiving element 20 can be increased by connecting the light-receiving element 20 and the resin base material 11 at the portion of the first surface 11F via the first connection member CM1. In other words, the connection strength between the substrate 10 and the first connection member CM1 can be increased by the bonding between resins in addition to the bonding between resin and metal.

Moreover, the first and second bonding pads 21 and 23 of the light-receiving element 20 are provided at positions where the first and second bonding pads 21 and 23 overlap the metal pads 13 in the Z-direction. Thereby, the absorption of the ultrasonic waves by the resin base material 11 can be suppressed while performing ultrasonic bonding of the conductive members MW on the bonding pads 21 and 23, and the bonding strength of the conductive members MW can be increased.

As shown in FIGS. 3A to 3C, the metal pad 13 includes a portion overlapping the input-side terminal 50 or the output-side terminal 60. The absorption or scattering of the ultrasonic waves by the resin base material 11 can be further reduced thereby. Moreover, the substrate 10 may be placed on a support surface while mounting the light-receiving element 20 on the metal pad 13, but the second surface 11B of the resin base material 11 located between the input terminal 50 and the output terminal 60 does not come into contact with the support surface. Therefore, the resin base material 11 may be deformed by stress due to the pressure applied to the metal pad 13. Such deformation of the resin base material 11 can be suppressed by the metal pad 13 partially overlapping the input terminal 50 or the output terminal 60. Further, the metal pad 13 may overlap the input-side terminal 50 and the output-side terminal 60.

Moreover, the first electrode 41 and the second electrode 43 of the light emitting element 40 preferably overlap the metal pad 13 in a plan view parallel to the first surface 11F of the resin base material 11. Thereby, it is possible to stably bond the conductive members MW3 and MW7 to the first electrode 41 and the second electrode 43 and increase the respective bonding strengths thereof.

Figure 5A:
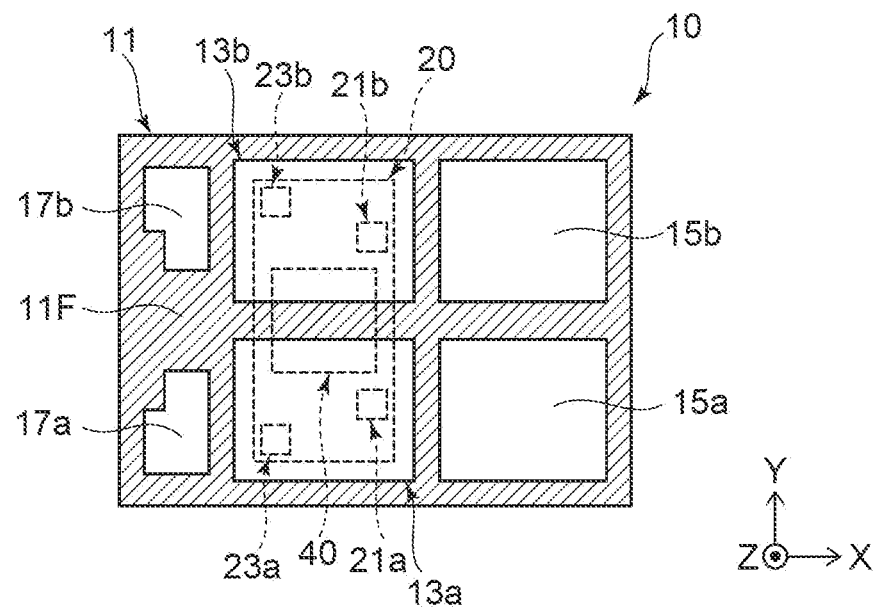
FIGS. 5A and 5B are schematic plan views showing substrates of the semiconductor device according to the embodiment.
Figure 5B:
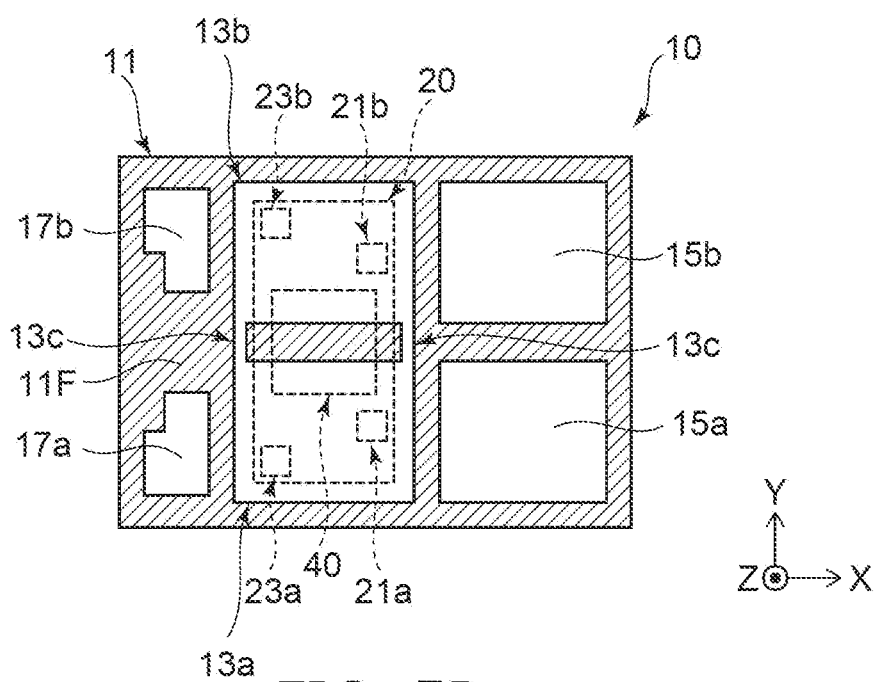

FIGS. 5A and 5B are schematic plan views showing substrates 10 of the semiconductor device 1 according to the embodiment. FIG. 5A is a plan view showing the first surface 11F of the resin base material 11. FIG. 5B is a plan view showing the first surface 11F of another substrate 10. The broken lines in the drawings illustrate the positions of the light-receiving element 20 and the light-emitting element 40.

As shown in FIG. 5A, the light-receiving element 20 is provided over the first metal pad 13a and the second metal pad 13b. The light-emitting element 40 also is provided over the first metal pad 13a and the second metal pad 13b on the light-receiving element 20.

The spacing between the first metal pad 13a and the second metal pad 13b is substantially equal to the spacing between the third metal pad 15a and the fourth metal pad 15b. The embodiment is not limited to the example; the spacing between the first metal pad 13a and the second metal pad 13b, for example, may be greater than the spacing between the third metal pad 15a and the fourth metal pad 15b. Also, the space between the first metal pad 13a and the second metal pad 13b may have uniform spacing as shown in FIG. 5A. Alternatively, the spacing may be different at the center from the spacing at the ends in the X-direction.

As shown in FIG. 5B, the first metal pad 13a may be linked to the second metal pad 13b via a metal connection part 13c. The first surface 11F of the resin base material 11A includes a portion surrounded with the first metal pad 13a, the second metal pad 13b, and two metal connection parts 13c.

The metal connection part 13c links the outer edge of the first metal pad 13a facing the third metal pad 15a and the outer edge of the second metal pad 13b facing the fourth metal pad 15b on the first surface 11F of the resin base material 11.

Another metal connection part 13c links the outer edge of the first metal pad 13a facing the fifth metal pad 17a and the outer edge of the second metal pad 13b facing the sixth metal pad 17b.

The first connection member CM1 that connects the substrate 10 and the light-receiving element 20 is preferably a conductive bonding material such as a silver paste or the like that provides a large bonding force with respect to metal. However, the first connection member CM1 may spread outward from the space between the metal pads 13 after being coated onto the first surface 11F of the resin base material 11. Thus, there may be a case where the spacing between the first connection member CM1 and the metal pads 15 is narrow, and the breakdown voltage is reduced between the metal pads 13 and the metal pads 15. In the example, the metal connection part 13c prevents the first connection member CM1 from spreading outward from the space between the metal pads 13. Thereby, it is possible to prevent the reduction of the breakdown voltage between the metal pads 13 and the metal pads 15.

Figure 6A:
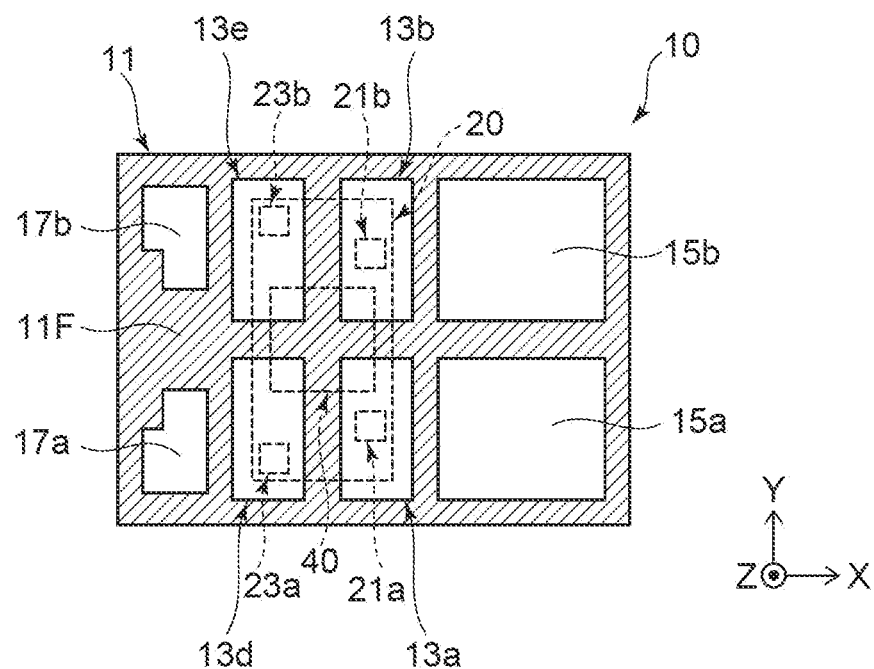
FIGS. 6A and 6B are schematic plan views showing the substrate of the semiconductor device according to modifications of the embodiment.
Figure 6B:
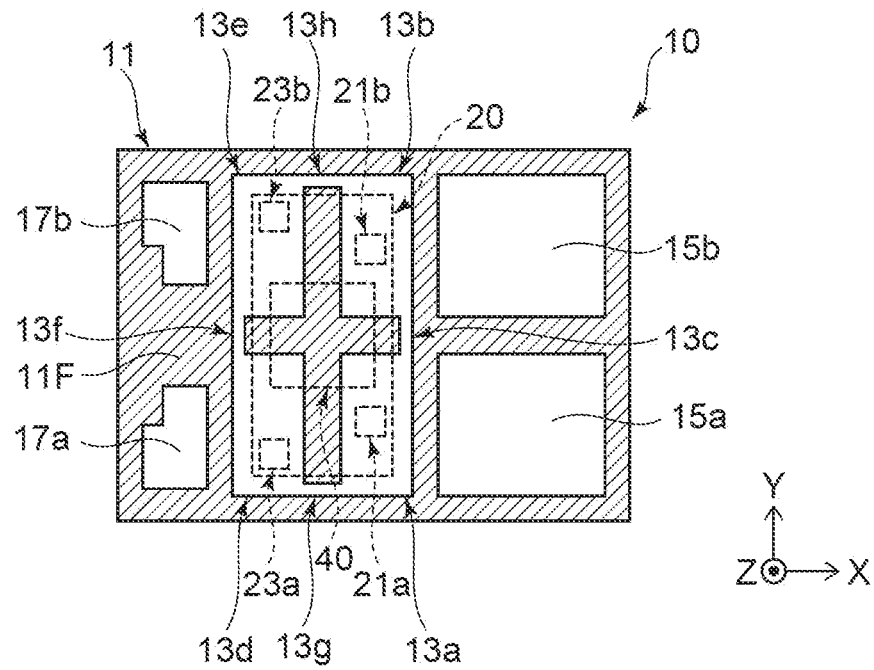

FIGS. 6A and 6B are schematic plan views showing the substrate 10 of the semiconductor device 1 according to modifications of the embodiment. FIGS. 6A and 6B are plan views showing the first surface 11F of the resin base material 11. The broken lines in the drawings illustrate the positions of the light-receiving element 20 and the light-emitting element 40.

In the example shown in FIG. 6A, the substrate 10 further includes a seventh metal pad 13d and an eighth metal pad 13e. The seventh metal pad 13d and the eighth metal pad 13e are provided on the first surface 11F of the resin base material 11.

The seventh metal pad 13d is provided between the first metal pad 13a and the fifth metal pad 17a. The seventh metal pad 13d is apart from the first and fifth metal pads 13a and 17a.

The eighth metal pad 13e is provided between the second metal pad 13b and the sixth metal pad 17b. The eighth metal pad 13e is apart from the second and sixth metal pads 13b and 17b. The seventh metal pad 13d and the eighth metal pad 13e are arranged in the Y-direction and apart from each other.

The spacings between the metal pads may be the same or different. The spaces between the metal pads may have uniform widths or may have non-uniform widths.

Thus, the thermal stress applied to the resin base material 11 can be reduced by providing the four metal pads 13 each having a small occupied area. Also, the light-receiving element 20 may have large connection strength to the substrate 10 provided by increasing the surface area of the first surface 11F of the resin base material 11 between the metal pads 13 that are next to each other.

In the Z-direction perpendicular to the first surface 11F of the resin base material 11, the first bonding pad 21a of the light-receiving element 20 overlaps the first metal pad 13a, and the second bonding pad 23a overlaps the seventh metal pad 13d. Also, the first bonding pad 21b of the light-receiving element 20 overlaps the second metal pad 13b in the Z-direction. The second bonding pad 23b overlaps the eighth metal pad 13e in the Z-direction. Moreover, the light-emitting element 10 is preferably mounted on the light-receiving element 40 such that four corners of the light-emitting element 10 overlap the metal pads 13a, 13b, 13d and 13e, respectively.

In the example shown in FIG. 6B, the metal connection parts 13c, 13f, 13g, and 13h are further included in the metal pad 13. The metal connection parts 13c, 13f, 13g, and 13h are provided on the first surface 11F of the resin base material 11 to surround the portion of the first surface 11F located between the first metal pad 13a and the second metal pad 13b, between the first metal pad 13a and the seventh metal pad 13d, between the second metal pad 13b and the eighth metal pad 13e, and between the seventh metal pad 13d and the eighth metal pad 13e.

The metal connection part 13c links the outer edge of the first metal pad 13a facing the third metal pad 15a and the outer edge of the second metal pad 13b facing the fourth metal pad 15b.

The metal connection part 13f links the outer edge of the seventh metal pad 13d facing the fifth metal pad 17a and the outer edge of the eighth metal pad 13e facing the sixth metal pad 17b. The metal connection part 13g links the outer edge along the X-direction of the first metal pad 13a and the outer edge along the X-direction of the seventh metal pad 13d. The metal connection part 13h links the outer edge along the X-direction of the second metal pad 13b and the outer edge along the X-direction of the eighth metal pad 13e. Thereby, the metal connection parts 13c, 13f, 13g, and 13h prevent the first connection member CM1 from spreading outward from the space between the multiple metal pads 13.

In FIG. 6B, the light-receiving element 20 also is provided such that the first bonding pad 21a overlaps the first metal pad 13a and the second bonding pad 23a overlaps the seventh metal pad 13d in the Z-direction perpendicular to the first surface 11F of the resin base material 11. Moreover, the first and second bonding pads 21b and 23b of the light-receiving element 20 overlap the second metal pad 13b and the eighth metal pad 13e, respectively.

The light-emitting element 40 is mounted on the light-receiving element 20 such that the four corners of the light-emitting element 40 overlap the metal pads 13a, 13b, 13d and 13e, respectively. Moreover, the first and second electrodes 41 and 43 of the light-emitting element 40 preferably overlap the metal pad 13 in a plan view parallel to the first surface 11F of the resin base material 11. Thereby, the conductive members MW3 and MW7 are stably bonded to the light-emitting element 40, and the bonding strengths thereof are increased.

Figure 7A:
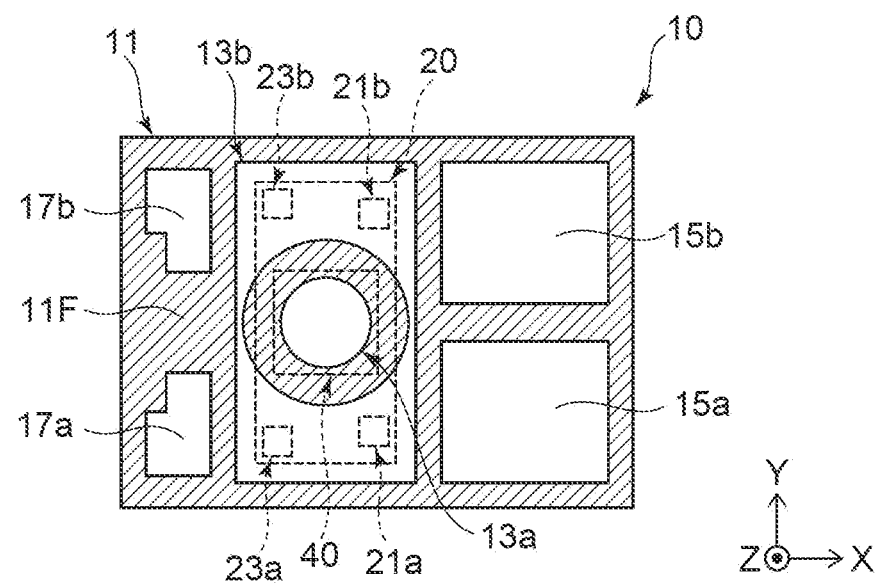
FIGS. 7A and 7B are schematic plan views showing the substrate of the semiconductor device according to other modifications of the embodiment.
Figure 7B:
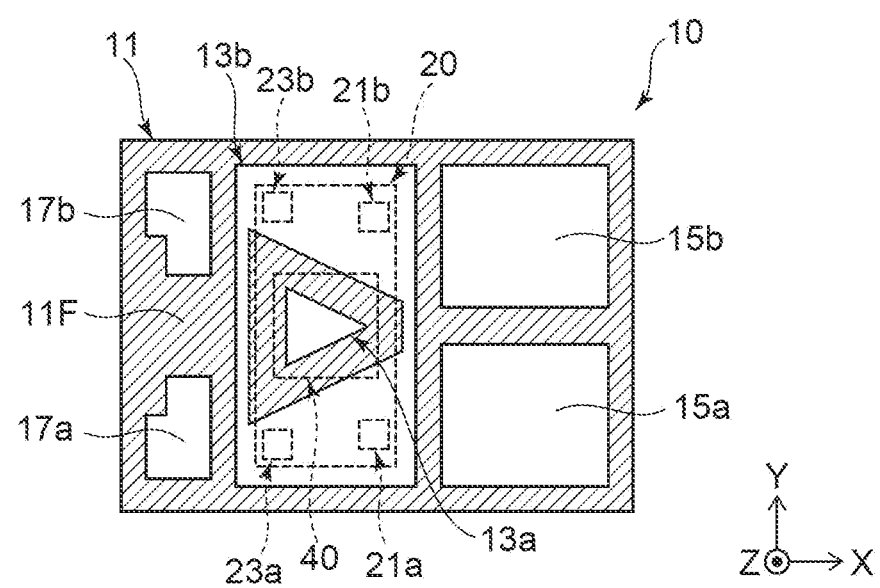

FIGS. 7A and 7B are schematic plan views showing the substrate 10 of the semiconductor device 1 according to other modifications of the embodiment. FIGS. 7A and 7B are plan views showing the first surface 11F of the resin base material 11. The broken lines in the drawings illustrate the positions of the light-receiving element 20 and the light-emitting element 40.

As shown in FIG. 7A, the second metal pad 13b is apart from the first metal pad 13a and surrounds the first metal pad 13a. The first metal pad 13a is, for example, circular.

The light-emitting element 40 is provided at a position where the light-emitting element 40 overlaps the first metal pad 13a in the Z-direction. The first bonding pads 21a and 21b and the second bonding pads 23a and 23b of the light-receiving element 20 are provided at positions where the bonding pads overlap the second metal pad 13b in the Z-direction.

In the example shown in FIG. 7B, the second metal pad 13b also is apart from the first metal pad 13a and surrounds the first metal pad 13a. The first metal pad 13a is, for example, triangular. The light-emitting element 40 is provided at a position where the light-emitting element 40 overlaps the first metal pad 13a in the Z-direction. The first bonding pads 21a and 21b and the second bonding pads 23a and 23b of the light-receiving element 20 are provided at positions where the bonding pads overlap the second metal pad 13b in the Z-direction.

In these examples, the light-receiving element 20 also is provided over the first metal pad 13a and the second metal pad 13b. By increasing the surface area of the first surface 11F of the resin base material 11 located between the first metal pad 13a and the second metal pad 13b, the occupied areas of the first and second metal pads 13a and 13b can be reduced, and it is possible to reduce the thermal stress in the resin base material 11 due to the different thermal expansion coefficients of the materials of the first and second metal pads 13a and 13b and the resin base material 11. The warp or deformation of the resin base material 11 can be suppressed thereby. Also, the light-receiving element 20 may have large connection strength to the substrate 10. The first metal pad 13a surrounded with the second metal pad 13b may have a shape not limited to the example above, and may be, for example, polygonal.

Moreover, in FIGS. 7A and 7B, the first electrode 41 and the second electrode 43 also preferably overlap the metal pad 13 in a plan view parallel to the first surface 11F of the resin base material 11. Thereby, the conductive members MW3 and MW7 are stably bonded to the light-emitting element 40, and the bonding strengths thereof are increased.

Figure 8:
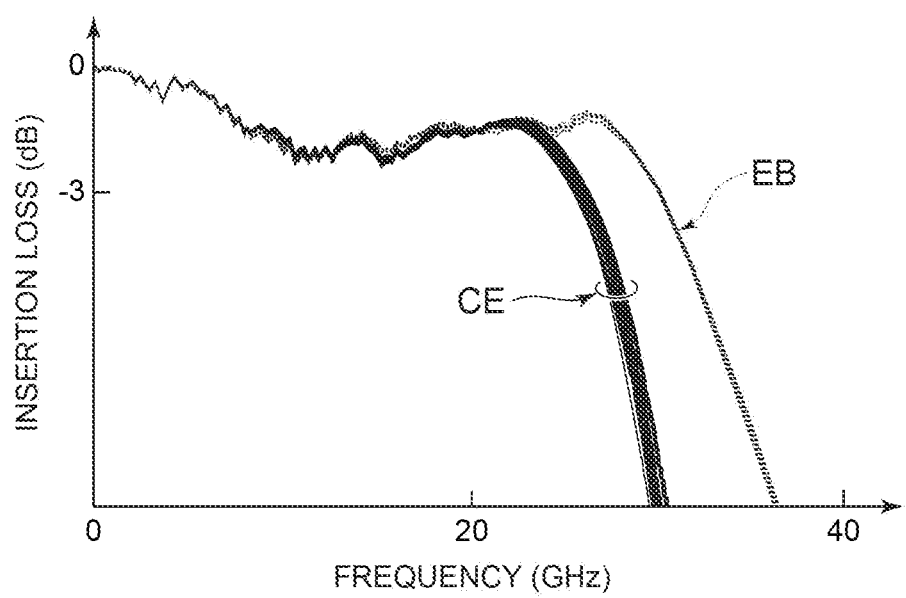
FIG. 8 is a graph showing characteristics of the semiconductor device according to the embodiment.

FIG. 8 is a graph showing characteristics of the semiconductor device 1 according to the embodiment. The horizontal axis is the frequency of the signal propagating between the first output-side terminal 60a and the second output-side terminal 60b. The vertical axis is the insertion loss between the first output-side terminal 60a and the second output-side terminal 60b.

"EB" shown in FIG. 8 illustrates the characteristic of the semiconductor device 1. "CE" illustrates the characteristic of a semiconductor device according to a comparative example. In the semiconductor device according to the comparative example, the first metal pad 13a and the second metal pad 13b (see FIG. 5A) are provided as a continuous body.

As shown in FIG. 8, the frequency band of the semiconductor device 1 is wider than the frequency band of the semiconductor device according to the comparative example. In other words, the frequency characteristics can be improved by dividing the metal pad 13, on which the light-receiving element 20 is mounted, into the first and second metal pads 13a and 13b.

In recent years, semiconductor devices such as memory elements and the like operate with higher speeds, and thus, the high speed operation is an urgent issue for the photo-relays used in testers thereof. As shown in FIG. 8, in the semiconductor device 1 according to the embodiment, high-frequency characteristics up to the 30 GHz band are achieved by thinning the substrate 10 and downsizing the entire semiconductor device 1. Furthermore, it can be seen that the signal propagates from the first output-side terminal 60a to the second output-side terminal 60b or in the opposite direction under the −3 dB bandwidth widened from 25 GHz to 30 GHz by mutually-separating the multiple metal pads on which the light-receiving element 20 is mounted. It is considered that such an effect can be achieved by the parasitic capacitance parallel to the signal path between the first output-side terminal 60a and the second output-side terminal 60b that is drastically reduced by subdividing the mount pad.

Embodiments include the following aspects:

Note 1

A semiconductor device, comprising:
a substrate including a resin base material having a first surface and first to third metal pads on the first surface, the first to third metal pads being arranged along the first surface, the third metal pad being apart from the first and second metal pads, the first surface including a portion provided between the first and second metal pads;
a light-receiving element provided at the first surface side of the resin base material, the light-receiving element including a front surface, a back surface, a first bonding pad and a second bonding pad, the back surface being provided at a side opposite to the front surface, the back surface being connected via a first connection member to the first metal pad, the second metal pad, and the portion of the first surface of the resin base material, the first and second bonding pads being provided on the front surface of the light-receiving element, the first bonding pad overlapping one of the first and second metal pads in a first direction perpendicular to the first surface of the resin base material, the second bonding pad overlapping one of the first and second metal pads in the first direction;

a switching element provided at the first surface side of the resin base material, the switching element including a front-side electrode, a backside electrode and a control pad, the front-side electrode being provided at a front surface side of the switching element, the backside electrode being provided at a back surface side opposite to the front surface side of the switching element and being connected to the third metal pad via a second connection member, the front-side electrode and the control pad being arranged at the front surface side of the switching element;

a first conductive member connected to the front-side electrode of the switching element and the first bonding pad of the light-receiving element, the first conductive member electrically connecting the front-side electrode and the first bonding pad;

a second conductive member connected to the control pad of the switching element and the second bonding pad of the light-receiving element, the second conductive member electrically connecting the control pad and the second bonding pad; and a light-emitting element provided on the front surface of the light-receiving element with a third connection member interposed, the third connection member transmitting light radiated from the light-emitting element toward the light-receiving element.

Note 2

The device according to note 1, wherein the second metal pad is apart from the first metal pad.

Note 3

The device according to note 1, wherein the substrate further includes a metal connection part provided on the first surface of the resin base material, the metal connection part linking the first metal pad and the second metal pad, and the first metal pad, the second metal pad, and the metal connection part surround the portion of the first surface of the resin base material.

Note 4

The device according to any one of notes 1 to 3, further comprising another switching element provided at the first surface side of the resin base material and electrically connected to the light-receiving element, wherein the substrate further includes a fourth metal pad provided on the first surface of the resin base material, the fourth metal pad being apart from the first to third metal pads, the first metal pad and the second metal pad are arranged in a second direction along the first surface of the resin base material, the third and fourth metal pads also being arranged in the second direction, and said another switching element is provided on the fourth metal pad via another second connection member.

Note 5

The device according to note 1, wherein the substrate further includes fifth and sixth metal pads provided on the first surface of the resin base material, the fifth and sixth metal pads being arranged in a second direction along the first surface of the resin base material, the first and second metal pads are arranged in the second direction, the first metal pad being positioned between the third metal pad and the fifth metal pad, the second metal pad being positioned between the third metal pad and the sixth metal pad, the resin base material includes the portion of the first surface extending between the first metal pad and the second metal pad, between the first metal pad and the fifth metal pad, between the second metal pad and the sixth metal pad, and between the fifth metal pad and the sixth metal pad, the light-receiving element has the back surface connected via the first connection member to the first metal pad, the second metal pad, the fifth metal pad, the sixth metal pad, and the portion of the first surface of the resin base material, the first bonding pad of the light-receiving element overlaps one of the first metal pad, the second metal pad, the fifth metal pad and the sixth metal pad in the first direction, and the second bonding pad of the light-receiving element overlaps one of the first metal pad, the second metal pad, the fifth metal pad and the sixth metal pad in the first direction.

Note 6

The device according to note 5, wherein the first metal pad, the second metal pad, the fifth metal pad, and the sixth metal pad are apart from each other.

Note 7

The device according to note 5, wherein the substrate further includes a first metal connection part provided between the first metal pad and the second metal pad, a second metal connection part provided between the second metal pad and the sixth metal pad, a third metal connection part provided between the fifth metal pad and the sixth metal pad, and a fourth metal connection part provided between the fifth metal pad and the first metal pad, the first to fourth metal connection parts being arranged to surround the portion of the first surface.

Note 8

The device according to note 1, wherein the second metal pad is apart from the first metal pad and surrounds the first metal pad.

Note 9

The device according to note 8, wherein the light-emitting element overlaps the first metal pad in the first direction perpendicular to the first surface of the resin base material.

Note 10

The device according to note 9, wherein the first bonding pad and the second bonding pad of the light-receiving element overlap the second metal pad in the first direction perpendicular to the first surface of the substrate.

Note 11

The device according to any one of notes 1 to 10, wherein the substrate further includes an input-side terminal and an output-side terminal provided on the resin base material,
wherein the resin base material has a second surface opposite to the first surface, the input-side terminal and the output-side terminal being provided on the second surface of the resin base material,
wherein the input-side terminal is electrically connected to the light-emitting element, and the output-side terminal is electrically connected to the switching element via the third metal pad and the second connection member.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and overview of the invention.

What is claimed is:

1. A semiconductor device, comprising:
a substrate including a resin base material having a first surface and first to third metal pads on the first surface, the first to third metal pads being arranged along the first surface, the third metal pad being apart from the first and second metal pads, the first surface including a portion provided between the first and second metal pads;
a light-receiving element provided at the first surface side of the resin base material, the light-receiving element including a front surface, a back surface, a first bonding pad and a second bonding pad, the back surface being provided at a side opposite to the front surface, the back surface being connected via a first connection member to the first metal pad, the second metal pad, and the portion of the first surface of the resin base material, the first and second bonding pads being provided on the front surface of the light-receiving element, the first bonding pad overlapping one of the first and second metal pads in a first direction perpendicular to the first surface of the resin base material, the second bonding pad overlapping one of the first and second metal pads in the first direction;
a switching element provided at the first surface side of the resin base material, the switching element including a front-side electrode, a backside electrode and a control pad, the front-side electrode being provided at a front surface side of the switching element, the backside electrode being provided at a back surface side opposite to the front surface side of the switching element and being connected to the third metal pad via a second connection member, the front-side electrode and the control pad being arranged at the front surface side of the switching element;
a first conductive member connected to the front-side electrode of the switching element and the first bonding pad of the light-receiving element, the first conductive member electrically connecting the front-side electrode and the first bonding pad;
a second conductive member connected to the control pad of the switching element and the second bonding pad of the light-receiving element, the second conductive member electrically connecting the control pad and the second bonding pad; and
a light-emitting element provided on the front surface of the light-receiving element with a third connection member interposed, the third connection member transmitting light radiated from the light-emitting element toward the light-receiving element.

2. The device according to claim 1, wherein
the second metal pad is apart from the first metal pad.

3. The device according to claim 1, wherein
the substrate further includes a metal connection part provided on the first surface of the resin base material, the metal connection part linking the first metal pad and the second metal pad, and
the first metal pad, the second metal pad, and the metal connection part surround the portion of the first surface of the resin base material.

4. The device according to claim 1, wherein
the light-emitting element partially overlaps the first metal pad and the second metal pad in the first direction.

5. The device according to claim 1, further comprising:
another switching element provided at the first surface side of the resin base material and electrically connected to the light-receiving element,
the substrate further including a fourth metal pad provided on the first surface of the resin base material, the fourth metal pad being apart from the first to third metal pads,
the first metal pad and the second metal pad being arranged in a second direction along the first surface of the resin base material, the third and fourth metal pads also being arranged in the second direction,
said another switching element being provided on the fourth metal pad via another second connection member.

6. The device according to claim 5, wherein
a first space provided between the first metal pad and the second metal pad is aligned in a third direction with a second space provided between the third metal pad and the fourth metal pad, the third direction crossing the second direction.

7. The device according to claim 1, wherein
the substrate further includes fifth and sixth metal pads provided on the first surface of the resin base material, the fifth and sixth metal pads being arranged in a second direction along the first surface of the resin base material,
the first and second metal pads are arranged in the second direction, the first metal pad being positioned between the third metal pad and the fifth metal pad, the second metal pad being positioned between the third metal pad and the sixth metal pad,
the first surface of the resin base material includes the portion extending between the first metal pad and the second metal pad, between the first metal pad and the fifth metal pad, between the second metal pad and the sixth metal pad, and between the fifth metal pad and the sixth metal pad,
the light-receiving element has the back surface connected via the first connection member to the first metal pad, the second metal pad, the fifth metal pad, the sixth metal pad, and the portion of the first surface of the resin base material, the first bonding pad of the light-receiving element overlaps one of the first metal pad, the second metal pad, the fifth metal pad and the sixth metal pad in the first direction, and the second bonding pad of the light-receiving element overlaps one of the first metal pad, the second metal pad, the fifth metal pad and the sixth metal pad in the first direction.

8. The device according to claim 7, wherein a first space provided between the first metal pad and the second metal pad is aligned in a third direction with a third space provided between the fifth metal pad and the sixth metal pad, the third direction crossing the second direction, and a fourth space provided between the first metal pad and the fifth metal pad is arranged in the second direction with a fifth space provided between the second metal pad and the sixth metal pad.

9. The device according to claim 7, wherein the first metal pad, the second metal pad, the fifth metal pad, and the sixth metal pad are apart from each other.

10. The device according to claim 7, wherein the substrate further includes a first metal connection part provided between the first metal pad and the second metal pad, a second metal connection part provided between the second metal pad and the sixth metal pad, a third metal connection part provided between the fifth metal pad and the sixth metal pad, and a fourth metal connection part provided between the fifth metal pad and the first metal pad, the first to fourth metal connection parts being arranged to surround the portion of the first surface.

11. The device according to claim 1, wherein the second metal pad is apart from the first metal pad and surrounds the first metal pad.

12. The device according to claim 11, wherein the light-emitting element overlaps the first metal pad in the first direction perpendicular to the first surface of the resin base material.

13. The device according to claim 12, wherein the first bonding pad and the second bonding pad of the light-receiving element overlap the second metal pad in the first direction perpendicular to the first surface of the substrate.

14. The device according to claim 1, wherein the substrate further includes an input-side terminal and an output-side terminal provided on the resin base material, the resin base material having a second surface opposite to the first surface, the input-side terminal and the output-side terminal being provided on the second surface of the resin base material, the input-side terminal being electrically connected to the light-emitting element, the output-side terminal being electrically connected to the switching element via the third metal pad and the second connection member.

15. The device according to claim 14, wherein the input-side terminal includes first and second input terminal parts arranged along the second surface of the resin base material, the first input terminal part being apart from the second input terminal part, the substrate further includes a seventh metal pad and an eighth metal pad provided on the first surface of the resin base material, the seventh metal pad being electrically connected to the first input terminal part, the eighth metal pad being electrically connected to the second input terminal part, and the light-emitting element is electrically connected to the first input terminal via the seventh metal pad and electrically connected to the second input terminal via the eighth metal pad.

16. The device according to claim 15, wherein the first metal pad is provided between the third metal pad and the seventh metal pad, and the second metal pad is provided between the third metal pad and the eighth metal pad.

* * * * *